United States Patent
Spreitzer et al.

(10) Patent No.: US 7,884,175 B2
(45) Date of Patent: Feb. 8, 2011

(54) METHOD FOR CONTROLLING THE MOLECULAR WEIGHT DURING POLY(ARYLENE VINYLENE) SYNTHESIS, AND POLYMERS PRODUCED THEREWITH

(75) Inventors: Hubert Spreitzer, Viernheim (DE); Heinrich Becker, Eppstein-Niederjosbach (DE); Elfriede Hufsky, Frankfurt (DE)

(73) Assignee: Merck Patent GmbH (DE)

( * ) Notice: Subject to any disclaimer, the term of this patent is extended or adjusted under 35 U.S.C. 154(b) by 245 days.

(21) Appl. No.: 10/553,534

(22) PCT Filed: Apr. 13, 2004

(86) PCT No.: PCT/EP2004/003860

§ 371 (c)(1),
(2), (4) Date: Nov. 29, 2005

(87) PCT Pub. No.: WO2004/093209

PCT Pub. Date: Oct. 28, 2004

(65) Prior Publication Data

US 2006/0247415 A1    Nov. 2, 2006

(30) Foreign Application Priority Data

Apr. 17, 2003   (DE) .................... 103 18 096

(51) Int. Cl.
*C08G 75/00* (2006.01)
*C08G 61/00* (2006.01)
(52) U.S. Cl. ........................... 528/391; 528/397
(58) Field of Classification Search .............. 528/392, 528/86, 391, 397
See application file for complete search history.

(56) References Cited

U.S. PATENT DOCUMENTS

| | | | |
|---|---|---|---|
| 4,539,507 A | 9/1985 | VanSlyke et al. | |
| 5,151,629 A | 9/1992 | VanSlyke | |
| 5,558,904 A | 9/1996 | Hsieh et al. | |
| 5,629,389 A * | 5/1997 | Roitman et al. | 525/534 |
| 5,679,757 A * | 10/1997 | Wudl et al. | 528/86 |
| 5,721,328 A * | 2/1998 | Armand et al. | 526/243 |
| 5,763,539 A * | 6/1998 | Stern et al. | 525/535 |
| 5,807,974 A * | 9/1998 | Kim et al. | 528/366 |
| 5,817,430 A | 10/1998 | Hsieh | |
| 5,876,865 A * | 3/1999 | Hsieh | 428/690 |
| 5,945,502 A * | 8/1999 | Hsieh et al. | 528/101 |
| 6,207,301 B1 * | 3/2001 | Ohnishi et al. | 428/690 |
| 6,414,104 B1 * | 7/2002 | Pei | 528/86 |
| 6,458,909 B1 | 10/2002 | Spreitzer et al. | |
| 6,586,554 B1 * | 7/2003 | Takahashi | 528/86 |
| 6,638,646 B2 | 10/2003 | Spreitzer et al. | |
| 6,743,525 B2 * | 6/2004 | Berntsen et al. | 428/690 |
| 6,887,973 B2 * | 5/2005 | Towns et al. | 528/422 |
| 6,905,785 B2 * | 6/2005 | Noguchi et al. | 428/690 |
| 6,936,683 B1 * | 8/2005 | Vanderzande et al. | 528/391 |
| 7,268,193 B2 * | 9/2007 | Marrocco et al. | 525/534 |
| 2001/0003602 A1 | 6/2001 | Fujita | |
| 2002/0064680 A1 | 5/2002 | Spreitzer et al. | |
| 2003/0055278 A1 * | 3/2003 | Bazan et al. | 558/411 |
| 2003/0088050 A1 | 5/2003 | Spreitzer et al. | |
| 2003/0227001 A1 * | 12/2003 | Li et al. | 252/301.35 |
| 2004/0002576 A1 * | 1/2004 | Oguma et al. | 528/4 |
| 2004/0059077 A1 * | 3/2004 | Holmes et al. | 526/218.1 |
| 2004/0096694 A1 * | 5/2004 | Tokailin et al. | 428/690 |
| 2004/0138405 A1 * | 7/2004 | Chen et al. | 528/86 |
| 2004/0206939 A1 | 10/2004 | Spreitzer et al. | |
| 2004/0214036 A1 * | 10/2004 | Bentsen et al. | 428/690 |
| 2004/0225056 A1 | 11/2004 | Spreitzer et al. | |
| 2005/0100737 A1 * | 5/2005 | Shim et al. | 428/411.1 |
| 2005/0176915 A1 * | 8/2005 | Cho et al. | 528/86 |
| 2005/0196775 A1 * | 9/2005 | Swager et al. | 435/6 |
| 2005/0214952 A1 * | 9/2005 | Stupp et al. | 438/1 |
| 2005/0247235 A1 * | 11/2005 | Voeght et al. | 106/31.27 |
| 2005/0263758 A1 * | 12/2005 | Treacher et al. | 257/40 |
| 2006/0208221 A1 * | 9/2006 | Gerhard et al. | 252/301.16 |
| 2006/0229427 A1 * | 10/2006 | Becker et al. | 528/86 |
| 2007/0185303 A1 * | 8/2007 | Stossel et al. | 528/86 |

FOREIGN PATENT DOCUMENTS

| | | |
|---|---|---|
| EP | 0 423 283 | 4/1991 |
| EP | 0 443 861 | 8/1991 |
| EP | 0 644 217 | 3/1995 |
| EP | 0 705 857 | 4/1996 |
| WO | WO-90/13148 | 11/1990 |

(Continued)

OTHER PUBLICATIONS

Holmes et al. Angew. Chem. Int. Ed., 1998, 37, 403-428.*

(Continued)

*Primary Examiner*—Mark Eashoo
*Assistant Examiner*—Liam J Heincer
(74) *Attorney, Agent, or Firm*—Connolly Bove Lodge & Hutz LLP

(57) ABSTRACT

The present invention relates to a process in which addition of certain bis(methyl)aryl compounds which have a further substituent other than hydrogen and on which at least one of the two methyl groups bears a leaving group, the molecular weight in the synthesis of poly(arylenevinylenes) is controlled reproducibly and can be deduced by the GILCH polymerization or by the sulfinyl precursor route, and to the polymers obtainable by means of the process according to the invention.

8 Claims, No Drawings

FOREIGN PATENT DOCUMENTS

| WO | WO-98/27136 | 6/1998 |
| --- | --- | --- |
| WO | WO-99/21936 | 5/1999 |
| WO | WO-99/24526 | 5/1999 |
| WO | WO-01/34722 | 5/2001 |
| WO | WO-02/072714 | 9/2002 |
| WO | WO-02/096970 | 12/2002 |
| WO | WO-03/019694 | 3/2003 |

OTHER PUBLICATIONS

Hontis, L, "The Gilch Polymerisation Towards $OC_1C_{10}$-PPV: Indications For a Radical Mechanism", Polymer 42 (2001), pp. 5793-5796.

Hsieh, B. R. et al., "A New Family of Highly Emissive Soluble Poly(p-phenylene vinylene) Derivatives. A Step Toward Fully Conjugated Blue-Emitting Poly(p-phenylene vinylenes)", J. Am. Chem. Soc. 120 (1998), pp. 231-232.

Hsieh, B. R. et al., "General Methodology Toward Soluble Poly(p-phenylenevinylene) Derivatives", Macromolecules 30 (1997), pp. 8094-8095.

Yu, Y. et al., "A Modified 1,6-Polymerization Route to Soluble Poly(P-Phenyl Vinylene) Derivatives—Synthesis and Mechanism", Polymer Preprints, Bd. 39, Nr. 1 (1998), pp. 161-162.

Taylor, R. M. et al., "Substituted PPV's for Blue Light", Synthetic Metals 102 (1999), pp. 1120-1121.

\* cited by examiner

METHOD FOR CONTROLLING THE MOLECULAR WEIGHT DURING POLY(ARYLENE VINYLENE) SYNTHESIS, AND POLYMERS PRODUCED THEREWITH

RELATED APPLICATIONS

This application is a national stage application (under 35 U.S.C. 371) of PCT/EP2004/003860 filed Apr. 13, 2004 which claims benefit to German application 103 18 096.6 filed Apr. 17, 2003.

For about 12 years, broad-based research has proceeded into the commercialization of display and illumination elements based on polymeric (organic) light-emitting diodes (PLEDs). This development was triggered by the fundamental developments which are disclosed in EP 423 283 (WO 90/13148). The only polymers which currently satisfy the market demands in relation to efficiency and lifetime are based on poly-(arylenevinylenes). Recently, a first product in the form of a relatively small display has also become available on the market in an electric shaver from Philips N.V. which contains a polymer of this class. However, distinct improvements are still needed in order to make these displays a real competitor to the currently market-leading liquid-crystal displays (LCD).

EP 423 283 and EP 443 861 describe, as polymeric materials for the light-emitting layer, poly(p-phenylenevinylenes) which have been modified on the aromatic ring with alkyl, alkoxy, halogen or nitro substituents to improve the properties. Such polymers have since then been investigated in a large number of studies.

WO 98/27136 describes aryl-substituted poly(p-arylenevinylenes) which are also suitable for generating green electroluminescence. A further improvement in the polymers described there is disclosed in WO 99/24526. Here, a defect in such polymers is also disclosed: depending on the polymer, varying fractions of triple and single bonds occur in the main chain instead of the double bond (TBB defect). The fraction of this defect is apparently in a reciprocal relationship to the achievable lifetime: a high defect fraction reduces the operative lifetime; a low fraction increases it significantly. The application WO 99/24526 mentioned discloses that the defect rate can be influenced by the substitution pattern used, and that this rate can be distinctly reduced starting from aryl-substituted monomers (according to WO 98/27136) by the introduction of CN, F, Cl, an amino, alkyl or (thio)alkoxy group.

WO 01/34722 (EP 1232225) disclosed that poly-(arylenevinylenes) which contain monomer units whose phenylene unit bears a further aryl substituent para or meta to a first aryl radical have this effect outlined in the abovementioned application to an unexpectedly marked extent. This allows the operative lifetime in EL elements to be increased even further. This is of course of great relevance to the application and economic significance. The high EL efficiencies are retained.

U.S. Pat. No. 5,558,904 discloses polymers analogously to those specified above, in which the two substituents are either unsubstituted or substituted only by short-chain substituents (fluorine, cyano, methoxy, phenyl). Homo-polymers or else copolymers having a fraction of such structures of greater than approx. 25 mol % are, however, found to be insoluble.

In the context of this application, solubility and insolubility will be defined as is also specified in WO 99/21936 (page 3, lines 2 to 7): the term "soluble polymer" thus means that it forms a clear, ungelled solution at room temperature or at least at a temperature below 60° C., preferably below 50° C., more preferably below 40° C., in the concentration range of at least 0.5% by weight in a common organic solvent (aromatic, and also nonaromatic solvents which may contain halogen atoms or else may be halogen-free, for example toluene, anisole, chlorobenzene, methylene chloride, chloroform, xylenes, dioxane, THF, cyclohexanone, and the like). This property is necessary in order to be able to ensure industrial processing to give thin films. In the sense of this definition, insoluble polymers are, in contrast, those which give rise to a clear solution only at distinctly lower concentrations or which gel even above approx. 60° C.

A particularly suitable synthesis method for poly-(arylenevinylenes) is what is known as GILCH polymerization which leads, starting from 1,4-bis(halomethyl)benzene which is substituted by solubility-promoting groups, in a base-induced manner to the desired soluble polymers (H. G. Gilch et al., *J. Polym. Sci.*: A-1 1966, 4, 1337). The poly-(phenylenehaloethylenes) formed as intermediates are converted directly by the base excess used to the conjugated poly(arylenevinylenes). An optimization of this method, as disclosed in WO 99/24526 and WO 98/27136, led already to polymers with a very low defect rate and increased the reproducibility of the synthesis. Reference is made here explicitly to the texts of these applications, and they are thus part of the present application by reference.

A further suitable synthesis method is the sulfinyl precursor route, the base-induced polymerization of 1-halomethyl-4-(sulfinylmethyl)arylenes. This is described, for example, in EP 644217 and EP 705857 and in the publication of A. J. J. M. van Breemen et al. (*Macro-molecules* 1999, 32, 5728-5735). The initially isolated poly(phenylenesulfinylethylene) polymers are converted in a second step thermally to the conjugated poly(arylenevinylenes). This method is part of the present application by reference.

As already indicated above, it is, however, frequently difficult for both methods to find monomers with suitable substituents which, on the one hand, lead to soluble polymers but, on the other hand, also have the desired electronic and/or positive polymerization properties.

There is currently an emerging development in the fabrication of displays based on light-emitting polymers, which is increasingly moving away from the common processes for surface coatings, for example by spincoating processes or knifecoating techniques, in favor of new spatially resolved printing processes in the widest sense, for example inkjet printing, offset printing, screenprinting processes, gravure printing and the like. For this purpose, it is necessary firstly to be able to vary the concentration of the polymer solution within a wide range and adjust it very precisely in order to obtain the desired layer thickness in the printing. For this purpose too, it is thus becoming increasingly important to have available highly soluble polymers. Secondly, it is likewise essential for these techniques to precisely adjust the viscosity of the solution in order to be able to optimize the printing properties for the appropriate printing process. Since the viscosity of a polymer solution is approximately proportional to the molecular weight of the polymer cubed, it is apparent that precise and reproducible control of the molecular weight is required for this purpose in particular. For example, US 2001/0003602 states that a molecular weight $M_w < 600$ kDa, preferably in the range from 20 to 100 kDa, is required for inkjet printing of poly(arylenevinylenes). For this purpose, WO 02/096970 specifies a preferred molecular weight range of $M_n < 300$ kDa and $M_w < 500$ kDa.

For this reason, it is desirable to have available a method for molecular weight control of the polymers, in order to obtain readily soluble polymers reproducibly with a multitude of different substituents, which can be used not only for surface coatings, but also for printing processes.

U.S. Pat. No. 5,817,430 describes the synthesis of poly-(arylenevinylenes) to which compounds R—H are added in the polymerization process and control the chain ends, R—H being a compound which contains at least one acidic proton, and R being a nucleophile. R is then intended to form the end groups of the polymer. Reduction of the molecular weight thus affords soluble polymers. In the subsequent publications of Hsieh et al. (*Macromolecules* 1997, 30, 8094-8095; *J. Am. Chem. Soc.* 1998, 120, 231-232) and of Ferraris et al. (*Macromolecules* 2000, 33, 2311), this method is described in detail: the reduction in the molecular weight is achieved by a modification of the GILCH polymerization, by the addition to the reaction mixture of nonpolymerizable acidic additives, for example 4-tert-butylbenzyl chloride, 4-tert-butylbenzyl bromide or 4-methoxyphenol. The molecular weight can then purportedly be controlled by variation of the ratio between the monomers and the nonpolymerizable additive. However, in-house experiments indicate that the addition of such additives, as proposed in U.S. Pat. No. 5,817,430, by Hsieh et al. and by Ferraris et al., does not have any significant influence on the molecular weight of the polymer. Subsequently, the results have likewise been contradicted in a publication by Vanderzande et al. (*Belg. Polymer* 2001, 42, 5793-5796), which showed that the additives do not exhibit the reported effect and that they barely reduce the molecular weight, or that the addition of these compounds leads to poorly reproducible polymerization results. These results are thus irreproducible even to those skilled in the art, so that there exists no prior art method of controlling and of reducing the molecular weight of poly(arylenevinylenes) in the GILCH polymerization or in-the sulfinyl precursor route.

Another method of obtaining homogeneous solutions which can be filtered without any problem from sparingly soluble or nonfilterable poly(arylenevinylenes) is illustrated in WO 03/019694. There, a crude solution is treated by mechanical processes (for example by ultrasound or by the use of high-shear dispersing stirrers). This results in comminution of the chemical or physical aggregates of the polymer chains and thus reduction in the molecular weight. This method can be used very advantageously in order to balance relatively small charge variations in the synthesis and to achieve a reproducible concentration-viscosity ratio. In addition, this process can also be used for controlled enhanced molecular weight degradation. However, the use of ultrasound, especially when the polymer solution is exposed to the ultrasound for a prolonged period, also has a negative influence on the performance of the polymer when used in PLEDs, so that this does constitute a means of making processible poly(arylenevinylenes) which would otherwise not be processible, but a more gentle solution for molecular weight control would be desirable in the long term.

There is thus still a great need for a process which enables the molecular weight of poly(arylenevinylenes) in the GILCH polymerization and in the sulfinyl precursor polymerization to be controlled and to be reduced in order to make obtainable other structures which would otherwise have led to insoluble material, and in order to adjust the properties of this important material class also to modern printing techniques.

It has now been found that, surprisingly, the addition of certain substituted bismethylaryl compounds which bear a leaving group, for example a halogen atom or a trifluoromethanesulfonate group, on at least one of the two methyl groups, and also, on each of the two methyl groups, a further substituent other than hydrogen to the polymerization process enables the molecular weight of poly-(arylenevinylenes) in the GILCH polymerization and in the sulfinyl precursor polymerization to be controlled and to be reduced effectively and reproducibly. At the same time, the properties of the polymers when used in PLEDs (efficiency, lifetime) remain unchanged and good.

The invention thus provides a process for the base-induced preparation of poly(arylenevinylenes) from bis(halomethyl)-arylenes or from halomethylsulfinylmethylarylenes, characterized in that the reaction is carried out in the presence of 0.1-80 mol %, preferably 0.5-60 mol %, more preferably 1-50 mol %, in particular 2-40 mol %, of one or more compounds of the formula (I):

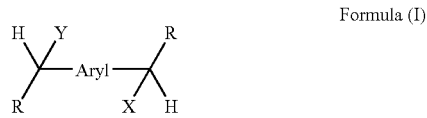

Formula (I)

where the symbols are defined as follows:

Aryl is the same or different at each instance and is a bivalent aromatic or heteroaromatic ring system which has from 2 to 40 carbon atoms and may be substituted by $R^1$ radicals or else be unsubstituted, or an $R^1$-substituted or unsubstituted stilbenylene unit; the two substituents CHXR and CHYR are arranged in such a way that there is an even number of aromatic atoms between them; the aryl and heteroaryl systems may also be part of a larger fused aromatic ring system; the possible substituents $R^1$ may potentially be situated at any free position;

R is the same or different at each instance and is an alkyl chain which has from 1 to 40 carbon atoms and may be straight-chain, branched or cyclic, and may also be substituted by one or more $R^1$ radicals or be unsubstituted, in which one or more nonadjacent carbon atoms may also be replaced by —$CR^2$=$CR^2$—, —C≡C—, —$NR^2$—, —O—, —S—, —CO—, —CO—O—, —$CONR^2$—, —O—CO—O—, and one or more hydrogen atoms may also be replaced by fluorine, an aromatic or heteroaromatic ring system which has from 2 to 40 carbon atoms and may be substituted by $R^1$ or be unsubstituted, an $R^1$-substituted or unsubstituted stilbenyl or tolanyl unit, —$Si(R^2)_3$, —$N(R^2)_2$, —$OR^2$ or a combination of these systems; the aryl and heteroaryl systems may also be part of a larger fused aromatic ring system; the possible substituents may potentially be situated at any free position;

X is the same or different at each instance and is Cl, Br, I, trifluoromethanesulfonate or arylsulfonate;

Y is the same or different at each instance and is Cl, Br, I, trifluoromethanesulfonate, arylsulfonate, —S(O)—$R^2$ or $R^1$;

$R^1$ is the same or different at each instance and is a straight-chain, branched or cyclic alkyl chain having from 1 to 40 carbon atoms, in which one or more non-adjacent carbon atoms may also be replaced by —$CR^2$=$CR^2$—, —C≡C—, —$NR^2$—, —O—, —S—, —CO—, —CO—O—, —$CONR^2$—, —O—CO—O—, and one or more hydrogen atoms may be replaced by fluorine, an aromatic or heteroaromatic ring system which has from 2 to 40 carbon atoms and may also be substituted by one or more nonaromatic $R^1$ radicals, a substituted or unsubstituted vinyl group or Cl, F, CN, $N(R^2)_2$, $B(R^2)_2$ or a combination of these systems; the aryl and heteroaryl systems may also be part of a larger fused aromatic ring system; the possible substituents may potentially be situated at any free position; two or more R¹ radicals together may also form a ring system;

R² is the same or different at each instance and is H, a straight-chain, branched or cyclic alkyl chain having 1 to 22 carbon atoms, in which one or more nonadjacent carbon atoms may also be replaced by —O—, —S—, —CO—O—, —O—CO—O—, and one or more hydrogen atoms may also be replaced by fluorine, an aryl or heteroaryl system which has from 2 to 40 carbon atoms and may also be substituted by one or more nonaromatic R¹.

The monomers are preferably compounds of the formula (XXVI)

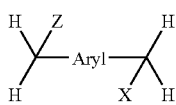

Formula (XXVI)

where aryl, R¹ and R² are each defined as described under formula (I) and the further symbols used are:

X is the same or different at each instance and is Cl, Br, I, trifluoromethanesulfonate or arylsulfonate;

Z is the same or different at each instance and is Cl, Br, I, trifluoromethanesulfonate, arylsulfonate or —S(O)R².

For the GILCH process, X and Z are preferably each Cl, Br or I. For the sulfinyl precursor process, X is preferably Cl, Br or I and Z is —S(O)R².

For the GILCH process, the monomers, i.e. 1,4-bis-(halomethyl)aryl compounds, are dissolved in the desired ratio relative to one another in a suitable concentration in a suitable solvent with addition of a suitable amount of compound of the formula (I), brought to a suitable reaction temperature and admixed with a suitable base. After a suitable reaction time has elapsed, the reaction can be terminated, for example by acid addition. Subsequently, the polymer is purified by suitable processes familiar to those skilled in the art, for example reprecipitation or extraction. Suitable solvents are, for example, ethers (e.g. diethyl ether, THF, dioxane, dioxolane, tert-butyl methyl ether), aromatic hydrocarbons (e.g. toluene, xylenes, anisole, methylnaphthalene), chlorinated compounds (e.g. chlorobenzene, dichlorobenzene) or mixtures of these solvents.

A suitable concentration range is the interval from 0.005 to 5 mol/l (monomer/solution volume). The range is preferably from 0.01 to 2 mol/l, more preferably from 0.01 to 0.5 mol/l.

The reaction temperature is generally between −80 to 200° C., preferably between 20 and 140° C.

Suitable bases are, for example, alkali metal hydroxides (e.g. NaOH, KOH), alkali metal hydrides (e.g. NaH, KH), alkali metal alkoxides (e.g. NaOEt, KOEt, NaOMe, KOMe, KOᵗBu), metal organyls (e.g. MeLi, ⁿBuLi, ˢBuLi, ᵗBuLi, PhLi) and organic amines and amides (e.g. LDA, DBU, DMAP, pyridine).

A suitable amount of base is in the range from 2 to 10 equivalents of base (based on one equivalent of monomer), preferably from 3.5 to 8 equivalents of base, more preferably from 4 to 6 equivalents of base.

The reaction time is generally between 5 minutes and 72 h, preferably between 0.5 and 24 h, more preferably between 1 and 6 h.

The addition of compound of the formula (I) for molecular weight control is between 0.1 and 80 mol % (based on the total amount of the other monomers), preferably between 0.5 and 60 mol %, more preferably between 1 and 50 mol %, in particular between 2 and 40 mol %, and is selected depending on the desired molecular weight of the polymer.

For the sulfinyl precursor route, the monomers, i.e. 1-halomethyl-4-sulfinylmethylaryl compounds, are dissolved in the desired ratio relative to one another in suitable concentration in a suitable solvent with addition of a suitable amount of compound of the formula (I), brought to a suitable reaction temperature and admixed with a suitable amount of base. After a suitable reaction time has elapsed, the reaction can be terminated, for example by acid addition. Subsequently, the precursor polymer is purified by suitable processes known to those skilled in the art, for example reprecipitation or extraction. The poly(arylenevinylene) compound is then obtained by thermal action on the polymer under suitable conditions, in solution or in a film.

Suitable solvents are, for example, ethers (e.g. diethyl ether, THF, dioxane, dioxolane, tert-butyl methyl ether), aromatic hydrocarbons (e.g. toluene, xylenes, anisole, methylnaphthalene), chlorinated compounds (e.g. chloro-benzene, dichlorobenzene, dichloromethane), but also DMSO or protic solvents (e.g. MeOH, EtOH, ⁿPrOH, ⁿBuOH, ⁿPeOH, ⁱPrOH, ˢBuOH, ˢPeOH, ᵗᵉʳᵗBuOH) or mixtures of these solvents.

A suitable concentration range is the interval from 0.005 to 5 mol/l (monomer/solution volume). The range is preferably from 0.01 to 2 mol/l, more preferably from 0.01 to 0.5 mol/l.

The reaction temperature is generally between −80 to 200° C., preferably between 0 and 120° C.

Suitable bases are, for example, alkali metal hydroxides (e.g. NaOH, KOH), alkali metal alkoxides (e.g. NaOEt, KOEt, NaOMe, KOMe, KOᵗBu) and organic amines and amides (e.g. LDA, DBU, DMAP, pyridine), but also alkali metal hydrides (e.g. NaH, KH) where nonprotic solvents are used, or metal organyls (e.g. MeLi, ⁿBuLi, ˢBuLi, ᵗBuLi, PhLi) when nonprotic solvents and not DMSO are used.

A suitable amount is in the range from 1 to 20 equivalents of base (based on one equivalent of monomer), preferably from 1 to 10 equivalents of base, more preferably from 1 to 5 equivalents of base.

The reaction time is generally between 5 minutes and 72 h, preferably between 0.5 and 6 h, most preferably between 1 and 4 h.

The addition of compounds of the formula (I) for molecular weight control is between 0.1 and 80 mol % (based on the total amount of the remaining monomers), preferably between 0.5 and 60 mol %, more preferably between 1 and 50 mol %, in particular between 2 and 40 mol %, and is selected depending on the desired molecular weight of the polymer.

The poly(aryleneethylene) precursor polymer is converted to the conjugated poly(arylenevinylene) by thermal treatment. A suitable temperature therefor is from 50 to 250° C., preferably from 80 to 200° C., more preferably from 100 to 150° C., and the conversion may be carried out either in solution or in a film.

Preference is given to selecting compounds of the formula (I) in which the symbols are:

Aryl is the same or different at each instance and is a bivalent aromatic ring system which has from 2 to 40 carbon atoms and may be substituted by up to 4 substituents R¹ or else be unsubstituted, or an R¹-substituted or unsubstituted stilbenylene unit; the two substituents CHXR and CHYR are arranged in such a way that there is an even number of aromatic atoms between them; the aryl system may also be part of a larger fused aromatic ring system; the possible substituents R¹ may potentially be situated at any free position;

R is as defined above;

X is the same or different at each instance and is Cl, Br, I;

Y is as defined above;

$R^1$, $R^2$ are each as defined above.

Particular preference is given in this context to compounds of the formula (I) for which:

Aryl is the same or different and is a bivalent aromatic ring system which has from 2 to. 20 carbon atoms and may be substituted by from 0 to 4 substituents $R^1$ or else be unsubstituted, or an $R^1$-substituted or unsubstituted stilbenylene unit; the two substituents CHXR and CHYR are arranged in such a way that the number of aromatic atoms of the aryl unit between them is a multiple of 4; the aryl system may also be part of a larger fused aromatic ring system; the possible substituents $R^1$ may potentially be situated at any free position;

R is the same or different at each instance and is an alkyl chain having from 1 to 20 carbon atoms, in which the carbon atom with which it, is joined to the CHX group or CHY group does not bear any hydrogen atoms and which may otherwise be straight-chain, branched or cyclic and may also be substituted by $R^1$ or be unsubstituted, in which one or more nonadjacent carbon atoms may also be replaced by —$CR^2$=$CR^2$—, —C≡C—, —$NR^2$—, —O—, —S—, —CO—, —CO—O—, —$CONR^2$—, —O—CO—C—, and one or more hydrogen atoms may also be replaced by fluorine, an aromatic or heteroaromatic ring system which has from 2 to 20 carbon atoms and may also be substituted by one or more nonaromatic $R^1$ groups, or —Si$(R^3)_3$, —$N(R^2)_2$, —$OR^2$; the aryl and heteroaryl systems may also be part of a larger fused aromatic ring system; the possible substituents may potentially be situated at any free position;

X is the same or different at each instance and is Cl or Br;

Y is the same or different at each instance and is Cl, Br or —S(O)$R^2$;

$R^1$, $R^2$ are each as defined above.

Some particularly preferred compounds of the formula (I) are the formulae (II) to (XXV) depicted below, possible substituents usually not being depicted for the sake of clarity:

Formula (II)

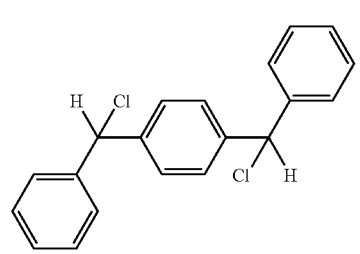

Formula (III)

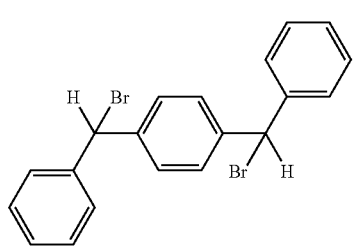

Formula (IV)

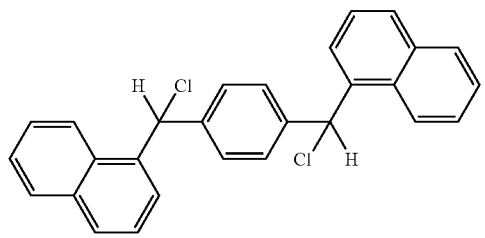

Formula (V)

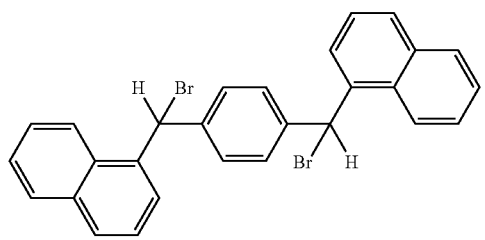

Formula (VI)

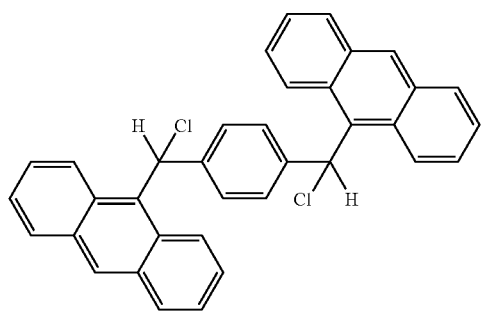

Formula (VII)

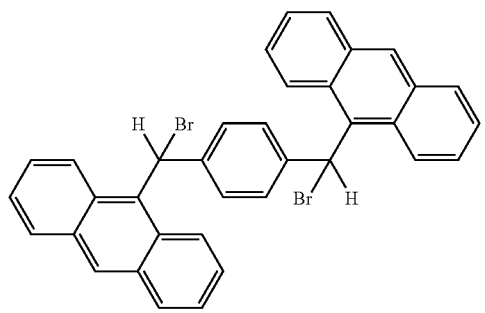

Formula (VIII)

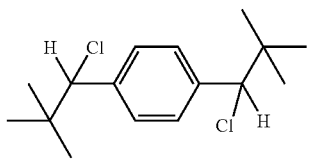

Formula (IX)

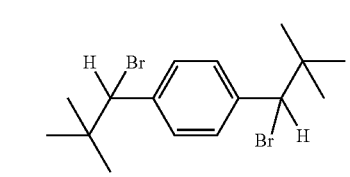

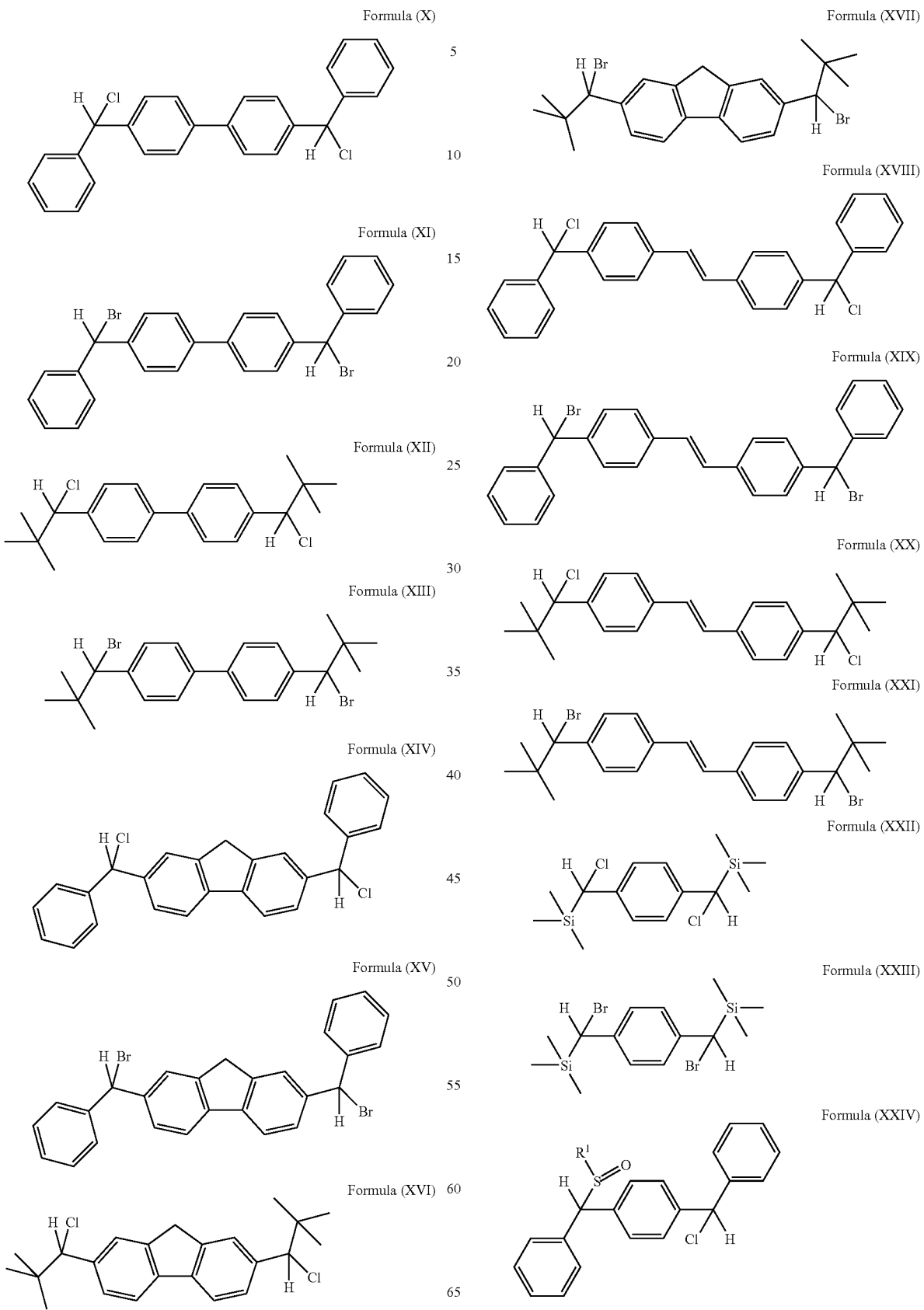

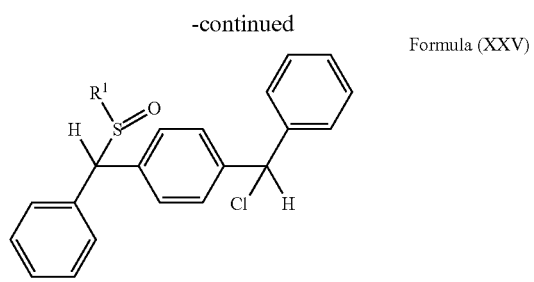

Formula (XXV)

The compound of the formula (I) is incorporated into the poly(arylenevinylene) formed in the polymerization. It may be incorporated into the polymer chain or as a polymer chain end group.

In order to investigate which fraction is actually incorporated and whether the incorporation takes place only at the chain ends or else within the chain, a molecule was synthesized which is substituted on the aromatic R radicals with one $CF_3$ group in each case (see Example 3: IA3). This compound was added to a polymerization (see Example 8: polymer P4), and the resulting polymer was analyzed by $^{19}F$ NMR spectroscopy. By addition of trifluorotoluene as an internal standard and integration over the signals, it was possible to show that the additive is also incorporated into the chain and not only at the chain ends, since the fluorine content of the polymer was higher than expected for a polymer that would contain the additive only at the chain ends.

Poly(arylenevinylenes) which are prepared by base-induced polymerization of bis(halomethyl)arylene or from halomethyl-sulfinylmethylarylene in the presence of 0.1-80 mol %, preferably 0.5-60 mol %, more preferably 1-50 mol %, in particular 2-40 mol %, of compounds of the formula (I) are likewise novel and inventive. As a result of the incorporation of the compound of the formula (I) into the polymer main chain or as a polymer end group, these units of the formula (I) are present in the end product.

The invention thus likewise provides poly(arylenevinylenes) containing at least 0.1 mol % of units of the formula (Ia) and/or (Ib)

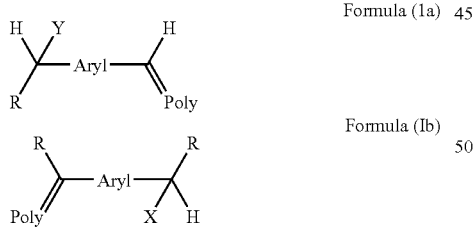

Formula (Ia)

Formula (Ib)

where aryl, R, X, Y, $R^1$ and $R^2$ are each defined as described above under formula (I), and
poly represents a bond to a poly(arylenevinylene) main chain.

The poly(arylenevinylenes) prepared by means of the process according to the invention exhibit comparable or improved electronic properties, such as lifetime and efficiency, but have distinctly better solubility than poly-(arylenevinylenes) according to the prior art.

The thus obtained poly(arylenevinylenes) can be used in PLEDs. To this end, the following general process is generally used, which is to be adapted correspondingly to the individual case:

A substrate (for example glass or else a plastic such as specially treated PET) is coated with a transparent anode material (for example indium tin oxide, ITO); subsequently, the anode is structured according to the desired application (for example photolithographically) and connected in a circuit. It is also possible here for the whole substrate and the corresponding circuit first to be obtained by a quite complicated process in order thus to enable what is known as active matrix control.

Subsequently, either over the full surface or only at the active (=anodic) sites, a conductive polymer, for example a doped polythiophene or polyaniline derivative, is generally applied first. This is generally done by coating processes which apply a dispersion of the corresponding polymer. Suitable for this purpose are in principle the processes described below for the light-emitting polymer. The layer thickness of this polymer intermediate layer may vary within wide ranges, but for practical application will be in the range between 10 and 1000 nm, preferably between 20 and 500 nm.

To this is then applied a solution of a poly-(arylenevinylene) which has been obtained by the process according to the invention. For multicolor display elements (displays), a plurality of different solutions are then applied in different regions in order to obtain corresponding colors. To this end, the poly-(arylenevinylenes) are first dissolved in a suitable solvent or solvent mixture and then filtered. Since the organic polymers and in particular the intermediate layers (interfaces) in the PLED are in some cases influenced to an extreme extent by oxygen or other air constituents, it is advisable to carry out this operation under protective gas. Suitable solvents are aromatic solvents, for example toluene, xylenes, anisole, chlorobenzene, but also others, for example cyclic ethers (e.g. dioxane, methyldioxane) or else amides (e.g. NMP or DMF), but also solvent mixtures as described in the application document WO 02/072714.

These solutions can be used to coat the above-described carriers, either over the whole surface, for example by spin-coating processes or knifecoating techniques, or else in a spatially resolved manner by printing processes in the widest sense, such as inkjet printing, offset printing, screenprinting processes, gravure printing processes and the like.

To these layers may optionally be applied further electron injection materials, for example by vapor deposition, or else from solution by methods as have been described for the emitting compounds. The electron injection materials used may, for example, be low molecular weight compounds such as triarylborane compounds or else aluminum trishydroxyquinolinate ($Alq_3$), but also corresponding polymers, for example poly-pyridine derivatives and the like. It is also possible to convert thin layers of the emitting compound by appropriate doping to electron injection layers.

Thereafter, a cathode is applied by vapor deposition. This is generally done by a vacuum process and may be accomplished, for example, either by thermal vapor deposition or by plasma spraying (sputtering). The cathode may be applied over the full surface or else structured through a mask. The cathodes used are generally metals having a low work function, for example alkali metals, alkaline earth metals and f transition metals, for example Li, Ca, Mg, Sr, Ba, Yb, Sm or aluminum, or else alloys of metals or multilayer structures comprising different metals. In the latter case, it is also possible to use metals which have a relatively high work function, for example Ag. It may also be preferred to introduce a very thin dielectric layer. (for example LiF, $BaF_2$ or the like) between the metal and the emitting polymer or the electron injection layer. The cathodes are generally between 10 and 10000 nm thick, preferably between 20 and 1000 nm thick.

Subsequently, the thus obtained PLEDs or displays are appropriately connected and encapsulated in order then to be tested or used.

The polymers synthesized by the process according to the invention are outstandingly suitable for use as electroluminescent materials since they have better solubility than analogous polymers which have been synthesized by conventional processes. As a result, they are, for example, more readily filterable in processing and form more homogeneous polymer films. Moreover, this process makes possible the synthesis of novel polymers or novel monomer combinations which lead to insoluble gels by conventional processes. The processing of the thus obtained polymers by various printing techniques is also distinctly improved over conventionally synthesized polymers.

Just like polymers which have been synthesized by conventional processes, the polymers obtained by the process according to the invention have comparatively high efficiencies and lifetimes in operation in PLEDs. Although this is not a direct advantage over the known polymers, it is essential for application that these properties are also retained in the process according to the invention.

Electroluminescent materials in the context of the invention are regarded as being materials which find use as an active layer in an electroluminescent device. Active layer means that the layer is capable, on application of an electric field, of emitting light (light-emitting layer) and/or that it improves the injection and/or the transport of the positive and/or negative charges (charge injection or charge transport layer).

The general structure of such electroluminescent devices is described, for example, in U.S. Pat. Nos. 4,539,507 and 5,151,629. Electroluminescent devices comprising polymers are described, for example, in WO 90/13148 or EP 0 443 861.

The invention likewise provides for the use of polymers which have been obtained by the process according to the invention in an electronic device, in particular as an electroluminescent material in electroluminescent devices. However, it is also possible for those skilled in the art without any further inventive activity also to utilize these polymers for other applications, for example in organic integrated circuits (O-ICs), in organic field-effect transistors (OFETs), in organic thin-film transistors (OTFTs), in organic solar cells (O-SCs), in nonlinear optics or else in organic laser diodes (O-laser), to name just a few possible applications.

The invention therefore further provides electronic devices, for example organic integrated circuits (O-ICs), organic field-effect transistors (OFETs), organic thin-film transistors (OTFTs), organic solar cells (O-SCs), organic photorefractive elements, nonlinear optics or organic laser diodes (O-laser), but in particular polymeric light-emitting diodes (PLEDs) comprising at least one inventive polymer.

The invention is illustrated in detail by the examples which follow without any intention thus to restrict it.

EXAMPLES

Synthesis of inventive additives (IA) of the formula (I) The identity of the compounds was proved by $^1H$ NMR spectroscopy; the purity was checked by HPLC measurements.

Example 1

Synthesis of IA1

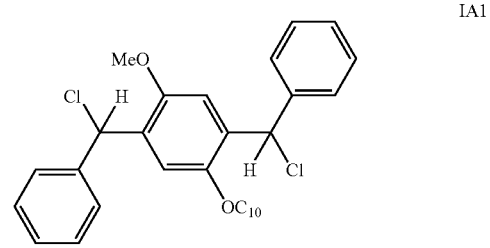

In this structure, $C_{10}$ is a 3,7-dimethyloctyl group. 2,5-Bis-(chloromethyl)-1-(3,7-dimethyloctyloxy)-4-methoxybenzene was synthesized according to the literature (H. Becker et al., *Macromolecules* 1999, 32, 4925-4932).

Synthesis of 2,5-bis(acetoxymethyl)-1-(3,7-diethyloctyloxy)-4-methoxybenzene

A 4 l four-neck flask with condenser, internal thermometer and magnetic stirrer was initially charged under nitrogen with 324.6 g (0.95 mol) of 2,5-bis(chloromethyl)-1-(3,7-dimethyloctyloxy)-4-methoxybenzene which were admixed with 233.3 g (2.85 mol) of sodium acetate, 145.5 g (1.43 mol) of acetic anhydride and 2000 ml of glacial acetic acid. The white suspension was heated to 90° C. Initially, a clear solution formed, then a white precipitate. After 2 h at 90° C., 1500 ml of acetic acid were removed on a rotary evaporator. The residue was admixed with 1500 ml of water. The waxy product which was obtained was dissolved by adding 1000 ml of hexane. The phases were separated and the aqueous phase was extracted with 2×300 ml of hexane. The combined organic phases were washed with 1×500 ml of water and dried over $Na_2SO_4$, and the solvent was removed under reduced pressure. 370 g (96% of theory) of a yellow oil were obtained, which became a waxy solid in a refrigerator. The crude product was used directly for the next stage without further purification or characterization.

Synthesis of 2,5-bis(hydroxymethyl)-1-(3,7-dimethyloctyl-oxy)-4-methoxybenzene

In a 3 l four-neck flask with condenser and precision glass stirrer, 144.9 g (3.62 mol) of sodium hydroxide were dissolved in 1800 ml of ethanol. After addition of 370 g (0.91 mol) of 2,5-bis(acetoxymethyl)-1-(3,7-dimethyloctyl-oxy)-4-methylbenzene, the mixture was stirred at room temperature for 3 h and at 45° C. for 2.5 h. The mixture was poured onto 2000 ml of water, and the solid which formed was filtered, stirred 3 times with water and filtered again. From the mother liquor, a second fraction was obtained which was likewise stirred 3× with water. The two combined fractions were stirred with hexane at room temperature for 0.5 h, filtered and dried. 183.8 g of white powder were obtained, which were used without further workup and without further characterization directly in the next stage.

Synthesis of 2-(3,7-dimethyloctyloxy)-5-methoxy-terephthal-aldehyde

A 4 l four-neck flask with condenser, precision glass stirrer, internal thermometer and dropping funnel was initially charged with 176.8 g (1.39 mol) of oxalyl chloride and 450 ml of dichloromethane and cooled to −50° C. To this was added dropwise within 45 min a solution of 253.5 g (3.43 mol) of DMSO in 450 ml of dichloromethane. The mixture was stirred for a further 30 min. A solution of 183.8 g (0.57 mol) of 2,5-bis(hydroxymethyl)-1-(3,7-dimethyloctyl-oxy)-4-methoxybenzene in 500 ml of dichloromethane was then added dropwise over 2.5 h. After addition of 100 ml, a white precipitate formed. After addition of 400 ml of the solution, a further 500 ml of dichloromethane were added. After the addition had been completed, the mixture was stirred for a further 15 min, then 151.8 g (1.5 mol) of triethylamine were added dropwise within 1 h. The mixture was allowed to come to room temperature overnight, then 1500 ml of water were added and the mixture was stirred for 0.5 h. The phases were separated, and the aqueous phase was extracted with 2×300 ml of water. The combined organic phases were washed with 1×500 ml of water and dried over $Na_2SO_4$, and the solvent was removed under reduced pressure. 175.6 g (58% of theory) of the product were obtained, which was used for the next stage without further purification and without further characterization.

2,5-Bis(phenylhydroxymethyl)-1-(3,7-dimethyloctyloxy)-4-methoxybenzene

A 6 l four-neck flask with precision glass stirrer, reflux condenser and 2 dropping funnels was initially charged with 26.7 g (1.1 mol) of magnesium turnings. The apparatus was baked out under argon. At room temperature, 10 ml of absolute THF and a few crystals of iodine were added and the mixture was stirred briefly. Subsequently, a few ml of bromobenzene were added dropwise to the unstirred solution, and at the point of dropwise addition was heated briefly with a hot air blower. After the start of the reaction, a total (including the amount already added) of 215 g (1.37 mol) of bromobenzene were added dropwise within 45 min. At the same time, 490 ml of absolute THF were added. After the dropwise addition, the mixture was stirred under reflux for 1.5 h. Subsequently, a solution of 175.6 g (0.55 mol) of 2-(3,7-dimethyloctyloxy)-5-methoxyterephthalaldehyde in 600 ml of absolute THF were added dropwise with ice cooling. After half of the addition, the gel which had formed was admixed with 3000 ml of distilled toluene and dissolved with heating to 70° C. After cooling to room temperature, the remaining solution of terephthalaldehyde was added dropwise, and the viscous solution was stirred at 70° C. for a further 4 h. The reaction mixture was stirred into 4000 ml of ice-water with 40 ml of conc. $H_2SO_4$. The phases were separated and the aqueous phase was extracted with 1×500 ml of ethyl acetate. The combined organic phases were washed with 1×300 ml of water and dried over $Na_2SO_4$, and the solvent was removed under reduced pressure. The crude product was stirred with n-hexane twice at room temperature and once at 50° C., and filtered. Further purification was effected by melting the crude product at 65° C. in hexane. This operation was effected three times more. 157.1 g (60% of theory) of the product were obtained in 95% purity, which was used directly for the further synthesis. NMR ($CDCl_3$): 7.38-7.44 (m, 4H), 7.24-7.35 (m, 6H), 7.09-9.12 (m, 1H), 7.04-7.07 (m, 1H), 6.54-6.57 (m, 2H, C(OH)H), 3.85-3.95 (m, 2H, $OCH_2$), 3.76+3.77 (2×s, 3H, $OCH_3$), 0.83-1.69 (m, 19H).

Synthesis of 2,5-bis(phenylchloromethyl)-1-(3,7-dimethyl-octyloxy)-4-methoxybenzene In a 2 l four-neck flask with precision glass stirrer, condenser, dropping funnel, thermometer and two wash bottles (one empty, one containing 15% sodium hydroxide solution), 156 g (0.327 mol) of 2,5-bis(phenylhydroxymethyl)-1-(3,7-dimethyloctyloxy)-4-methoxybenzene were slurried in 600 ml of hexane and admixed with 1 ml of pyridine. To this was slowly added dropwise at room temperature 155.7 g (1.31 mol) of thionyl chloride. The mixture was stirred at room temperature for 15 h and under reflux for 2.5 h. For workup, the reaction mixture was admixed at room temperature with stirring with 400 ml of saturated $NaHCO_3$ solution and stirred over night. The phases were separated and the aqueous phase was extracted with 1×200 ml of hexane. The combined organic phases were washed with 1×200 ml of water and dried over $Na_2SO_4$. The solvent was removed under reduced pressure and the crude product was purified by short-path distillation carried out twice (1. 140-195° C., cooling 40° C., $<10^{-3}$ mbar, 2. 185° C., cooling 40° C., $<10^{-3}$ mbar). 121 g (72% of theory) were obtained. NMR ($CDCl_3$): 7.34-7.40 (m, 4H), 7.20-7.34 (m, 6H), 6.88 (s, 1H), 6.84 (s, 1H), 5.98-6.02 (m, 2H, CHCl), 3.79-3.92 (m, 2H, $OCH_2$), 3.71 (s, 3H, $OCH_3$), 0.80-1.72 (m, 19H).

Example 2

Synthesis of IA2

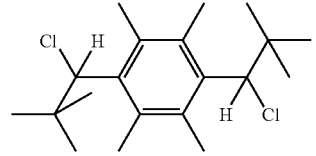

IA2

1,4-Diformyl-2,3,5,6-tetramethylbenzene (A. P. Yakubov et al., *Tetrahedron* 1993, 49, 3397) and 1,4-bis(1-hydroxy-2,2-dimethylpropyl)-2,3,5,6-tetramethylbenzene (D. Casarini et a., *J. Org. Chem.* 1996, 61, 6240) were synthesized according to the literature.

Synthesis of 1,4-bis(1-chloro-2,2-dimethylpropyl)-2,3,5,6-tetramethylbenzene In a 1 l four-neck flask with mechanical stirrer, reflux condenser, dropping funnel, thermometer and two wash bottles (one empty, one containing 15% sodium hydroxide solution), 61.31 g (0.2 mol) of 1,4-bis(1-hydroxy-2,2-dimethylpropyl)-2,3,5,6-tetramethylbenzene were suspended in 32 g (0.41 mol, 33 ml) of pyridine and 100 ml of hexane. To this were slowly added dropwise with stirring 48.4 g (0.41 mol, 30 ml) of thionyl chloride, at such a rate that the internal temperature did not exceed 50° C. The mixture was then heated under reflux for 5 h. After cooling, the reaction solution was admixed cautiously with 200 ml of ice-water with stirring. 400 ml of ethyl acetate were then added, and the phases were separated. The aqueous phase was extracted with 2×100 ml of ethyl acetate. The combined organic phases were washed with 100 ml of NaHCO$_3$ solution and with 3×100 ml of water, and dried over MgSO$_4$. The product was purified by repeated recrystallization from ethyl acetate/hexane. Yield: 20.98 g (61% of theory).

$^1$H NMR (CDCl$_3$): 0.98 (s, 18 H, tert-butyl groups), 2.35 (s, 12 H, Me), 4.73 (s, 2 H, CHCl).

Example 3

Synthesis of IA3

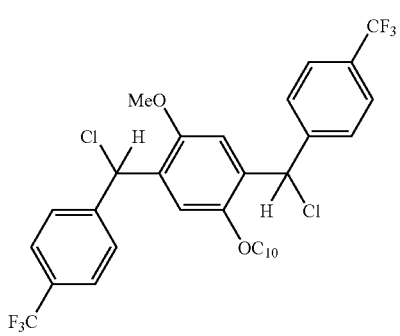

2,5-Bis(p-trifluoromethylphenylchloromethyl)-1-(3,7-dimethyloctyloxy)-4-methoxybenzene was synthesized in analogy to the synthesis of IA1. The purification was effected by short-path distillation carried out twice (1. 150-215° C., cooling 40° C., <10$^{-3}$ mbar, 2. 191° C., cooling 40° C., <10$^{-3}$ mbar). $^1$H NMR (CDCl$_3$): 7.78-7.85 (m, 4H), 7.49-7.60 (m, 4H), 6.95 (s, 1H), 6.92 (s, 1H), 6.02-6.06 (m, 2H, CHCl), 3.86-3.99 (m, 2H, OCH$_2$), 3.79 (s, 3H, OCH$_3$), 0.80-1.75 (m, 19H). $^{19}$F NMR (CDCl$_3$): −66.8 ppm (against CCl$_3$F as an internal standard).

This compound was synthesized in order to investigate the incorporation into the polymer by $^{19}$F NMR spectroscopy.

Example 4

Synthesis of Typical Monomers

The synthesis of possible monomers for the polymerization according to GILCH has already been shown in the application documents WO 01/34722 (EP 1232225) and WO 99/24526. The synthesis of possible monomers for the polymerization according to the sulfinyl precursor route has been published by A. J. van Bremen et al. (*J. Org. Chem.* 1999, 64, 3106). At this point, reference is therefore merely made to these documents.

The monomers used by way of example below are shown here once again for the sake of clarity:

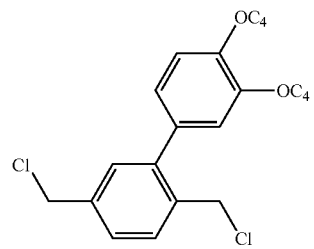

M1

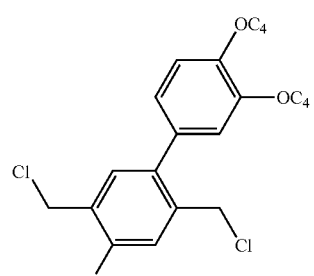

M2

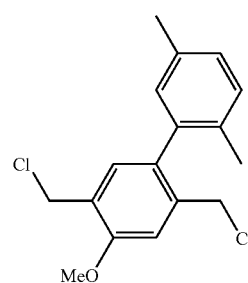

M3

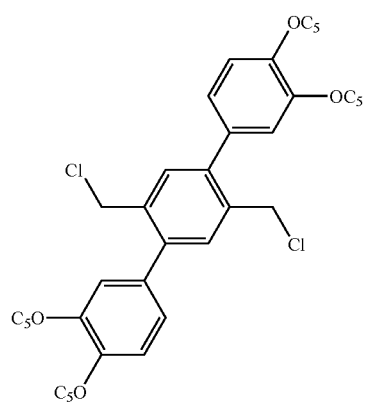

M4

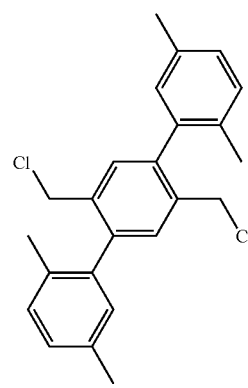

M5

-continued

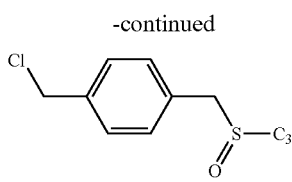

M6

In these structures, $C_4$ is a 2-methylpropyl group, $C_5$ a 2-methylbutyl group and $C_8$ an $^n$octyl group.

Polymer Synthesis

In the following, the percentage molar amount of the inventive additive (IA1, IA2 and IA3) is based in each case on the total molar amount of monomer used.

Example 5

Synthesis of Polymer P1

Copolymer of 50% M4, 40% M1 and 10% M5 with addition of 10 mol % of IA1:

In a dry 1 l four-neck flask with mechanical Teflon stirrer, reflux condenser, thermometer and dropping funnel, 570 ml of dry oxygen-free 1,4-dioxane were heated to 99° C. A solution of 2.687 g (4 mmol) of M4, 1.265 g (3.2 mmol) of M1, 0.307 g (0.8 mmol) of M5 and 0.411 g (0.8 mmol) of IA1 in 30 ml of dry 1,4-dioxane was then added. A solution of 2.36 g (21 mmol) of potassium tert-butoxide in 21 ml of dry 1,4-dioxane was then added dropwise within 5 minutes to the intensively stirred mixture. This changed the color from colorless through green to yellow-green. After 5 minutes, a further 1.79 g (16 mmol) of potassium tert-butoxide in 16 ml of dry 1,4-dioxane were added. After stirring at from 98 to 100° C. for 2 h, the mixture was cooled to 55° C. and a mixture of 4 ml of acetic acid and 4 ml of 1,4-dioxane was added. The now yellow solution was poured into 850 ml of intensively stirred water. The precipitated polymer was isolated by filtration through a polypropylene filter, washed with methanol and dried under reduced pressure. The crude polymer was dissolved in 250 ml of THF at 60° C. and precipitated by addition of 250 ml of methanol at 40° C. After drying under reduced pressure, this step was carried out once more. After drying under reduced pressure, 1.65 g (41% of theory) of the polymer P1 were obtained as bright yellow fibers.

GPC (polystyrene standard, UV detection 254 nm): $M_w$=351 k, $M_n$=73k.

A comparative polymer C1 which was synthesized under otherwise identical conditions, but without addition of IA1, formed an insoluble gel.

Example 6

Synthesis of Polymer P2 (3)

Copolymer of 50% M1, 35% M2 and 15% M3 with addition of 10 mol % of IA2:

In a dry 3 l four-neck flask with mechanical Teflon stirrer, reflux condenser, thermometer and dropping funnel, 1700 ml of dry oxygen-free 1,4-dioxane were heated to 99° C. A solution of 5.63 g (14.25 mmol) of M1, 4.24 g (9.98 mmol) of M2, 1.32 g (4.28 mmol) of M3 and 0.98 g (2.85 mmol) of IA2 in 25 ml of dry 1,4-dioxane was then added. A solution of 8.30 g (74 mmol) of potassium tert-butoxide in 74 ml of dry 1,4-dioxane was then added dropwise within 5 minutes to the intensively stirred mixture. This changed the color from colorless through yellow to yellow-orange. After 5 minutes, a further 7.7 g (68.5 mmol) of potassium tert-butoxide in 70 ml of dry 1,4-dioxane were added. After stirring at from 98 to 100° C. for 2 h, the mixture was cooled to 50° C. and a mixture of 17 ml of acetic acid and 18 ml of 1,4-dioxane was added. The now orange solution was poured into 1900 ml of intensively stirred water. The precipitated polymer was isolated by filtration through a polypropylene filter, washed with methanol and dried under reduced pressure. The crude polymer was dissolved in 750 ml of THF at 60° C. and precipitated by addition of 750 ml of methanol at 40° C. After washing with methanol and drying under reduced pressure, this step was carried out once more with 500 ml of THF and 500 ml of methanol. After drying under reduced pressure, 3.40 g (43% of theory) of the polymer P2 (3) were obtained as yellow-orange fibers.

GPC (polystyrene standard, UV detection 254 nm): $M_w$=579 k, $M_n$=145 k.

A comparative polymer C2 which was synthesized under otherwise identical conditions without inventive additive IA2 had an $M_w$=1120 k and an $M_n$=342 k.

Example 7

Synthesis of Polymer P3

Homopolymer composed of 100% M6 with addition of 10 mol % of IA1:

In a dry 500 ml four-neck flask with mechanical Teflon stirrer, thermometer and dropping funnel, a solution of 6.0 g (20 mmol) of M6 and 1.03 g (2 mmol) of IA1 in 140 ml of dry THF was degassed at 30° C. for 1 h by passing a nitrogen stream through the solution. To this was added a degassed solution of 2.36 g (21 mmol) of potassium tert-butoxide in 60 ml of dry oxygen-free THF in one portion, and the mixture was stirred at 30° C. for 1 h. The reaction mixture was then poured into 1000 ml of vigorously stirred ice-water and the precipitated polymer was isolated by filtration through a polypropylene filter, washed with methanol and dried under reduced pressure. The crude polymer was dissolved at 60° C. in 500 ml of THF, precipitated by addition to 750 ml of methanol, filtered and dried. This step was repeated once more. After drying under reduced pressure, 3.61 g (58% of theory) of the polymer P3 were obtained as colorless fibers.

GPC (polystyrene standard, UV detection 254 nm): $M_w$=483 k, $M_n$=173 k.

A comparative polymer C3 which was synthesized under otherwise identical conditions but without inventive additive IA3 had an $M_w$=812 k and an $M_n$=253 k.

The thermal conversion of these polymers unsubstituted on the aryl unit to poly(arylenevinylenes) leads to insoluble polymers. This conversion here was therefore not carried out in solution.

Example 8

Synthesis of Polymer P4

Copolymer of 50% M4, 40% M1 and 10% M5 with addition of 10 mol % of IA3:

The synthesis of P4 was carried out in analogy to P1, except that the additive IA3 (0.518 g, 0.8 mmol) was used here in order to investigate its incorporation into the polymer by $^{19}$F NMR spectroscopy. No electroluminescence analyses thereof were carried out. For this polymer, a molecular weight of $M_w$=382 k and $M_n$=84 k was determined by GPC with internal polystyrene standard.

For $^{19}$F NMR spectroscopy analysis, 5 mg of the polymer P4 with addition of 1.5·10$^{-3}$ mg (1.03·10$^{-5}$ mol) of trifluorotoluene as a quantitative reference were dissolved in 0.8 ml of CDCl$_3$, and the $^{19}$F NMR spectrum was recorded. The signal of trifluorotoluene was calibrated to −63.9 ppm. The $^{19}$F signal of the polymer was detected as a broadened signal at −64.5 to −66 ppm. By integration over the fluorine signal of the polymer and of the reference substance, a fluorine content of the polymer of approx. 34 ppm was determined. From this, it can be determined that the additive IA3 is also incorporated into the polymer chain and does not only constitute the end groups of the polymer. Were IA3 only to constitute the end groups, a fluorine content of approx. 11 ppm would be expected.

Just as described for polymer P1, P2 (3), P3 and P4, further polymers were synthesized with the process according to the invention and comparative polymers with conventional processes. The polymers are compiled in Table 1 together with the results of the GPC determination of the molecular weight, viscosity data and characterization of the electroluminescence (where possible).

Example 9

Production and Characterization of LEDs

LEDs were produced by the general process outlined below. This had to be adapted in the individual case to the particular circumstances (for example solution viscosity and optimal layer thickness of the compound in the device). The LEDs described below were in each case two-layer systems, i.e. substrate//ITO//PEDOT//polymer//cathode. PEDOT is a polythiophene derivative.

General Process for Producing High-Efficiency, Long-Lifetime LEDs:

After the ITO-coated substrates (for example glass supports, PET films) have been cut to the correct size, they are cleaned in an ultrasound bath in several cleaning steps (for example soap solution, Millipore water, isopropanol).

TABLE 1

| Polymer | M1[a] | M2[a] | M3[a] | M4[a] | M5[a] | M6[a] | IA1[b] | IA2[b] | Comment | $M_n$[c] | $M_w$[c] | Viscosity[d] | Max. eff.[e] | LD[f] | $\lambda_{max}$[g] |
|---|---|---|---|---|---|---|---|---|---|---|---|---|---|---|---|
| P1 | 40 | | | 50 | 10 | | 10 | | | 73k | 351k | 2.2 | 13.8 | 460 | 518 |
| C1 | 40 | | | 50 | 10 | | | | gelled | | | | | | |
| P2(1a) | 50 | 35 | 15 | | | | | 2.5 | | 214k | 947k | 10.2 | 11.1 | 1050 | 545 |
| P2(1b) | 50 | 35 | 15 | | | | | 2.5 | | 210k | 968k | 10.1 | 11.2 | 1070 | 544 |
| P2(1c) | 50 | 35 | 15 | | | | | 2.5 | | 209k | 961k | 10.0 | 11.3 | 985 | 545 |
| P2(2) | 50 | 35 | 15 | | | | | 5 | | 159k | 778k | 5.7 | 11.1 | 1100 | 544 |
| P2(3) | 50 | 35 | 15 | | | | | 10 | | 145k | 579k | 2.7 | 10.9 | 785 | 545 |
| P2(4) | 50 | 35 | 15 | | | | | 15 | | 122k | 428k | 1.7 | 10.8 | 820 | 546 |
| C2 | 50 | 35 | 15 | | | | | | | 342k | 1120k | 22 | 11.5 | 1000 | 544 |
| P3 | | | | | | 100 | 10 | | | 173k[h] | 483k[h] | n.a. | n.a. | n.a. | |
| C3 | | | | | | 100 | | | | 253k[h] | 812k[h] | n.a. | n.a. | n.a. | |
| P4(1) | 25 | 60 | 15 | | | | | 5 | | 200k | 887k | 6.9 | 10.5 | 2200 | 551 |
| P4(2) | 25 | 60 | 15 | | | | | 10 | | 95k | 563k | 3.0 | 10.2 | 2000 | 553 |
| C4 | 25 | 60 | 15 | | | | | | gelled | | | | | | |
| P5(1) | 40 | | | 30 | 30 | | 5 | | | 201k | 822k | 9.1 | 15.6 | 621 | 513 |
| P5(2) | 40 | | | 30 | 30 | | 10 | | | 156k | 586k | 4.6 | 13.8 | 523 | 513 |
| C5 | 40 | | | 30 | 30 | | | | gelled | | | n.a. | n.a. | n.a. | |

[a]Data in percent based on the overall composition of the polymer without taking into account the inventive additive.
[b]Amount of the inventive additive in percent based on the total amount of monomer.
[c]in g/mol; determined by GPC (THF; column set SDV500, SDV1000, SDV10 000 (from PSS) 35° C., UV detection 254 nm, polystyrene standard).
[d]in mPas; 0.5% solution in toluene, 40 s$^{-1}$.
[e]Maximum efficiency in cd/A, for the production of the PLEDs see Example 9.
[f]Lifetime up to decline in the starting brightness to 80%; measurement at room temperature and a starting brightness of 1000 cd/m$^2$; start of measurement 1 h after start of current flow; for the production of the PLEDs Example 9.
[g]Maximum of the emission (electroluminescence) in nm.
[h]Molecular weight based on the precursor polymer.

From the comparison of the example polymers P with the comparative polymers C, it is readily discernible that the molecular weight and thus the solubility of the polymers and viscosity of the polymer solutions is influenced very strongly by the selected process. Specifically polymers which have been synthesized by prior art processes frequently have too high a molecular weight for many applications or are found to be unprocessible or insoluble in the sense of this text.

The entries in Table 1 demonstrate that the process according to the invention has excellent suitability for molecular weight control in the synthesis of poly(arylenevinylenes). At the same time, the properties of the polymers on use in PLEDs (efficiency, lifetime) are not influenced. Furthermore, the process according to the invention significantly improves the reproducibility, as can be seen readily by the results for polymer P2(1a)-(1c).

For drying, they are blown with an N$_2$ gun and stored in a desiccator. Before they are coated with the poly(arylenevinylenes), they are treated with an ozone plasma unit for approx. 20 minutes. A solution of the particular poly(arylenevinylenes) (generally having a concentration of 4-25 mg/ml in, for example, toluene, chlorobenzene, xylene: cyclohexanone (4:1)) is prepared and dissolved at room temperature by stirring. Depending on the compound, it may also be advantageous to stir at 50-70° C. for a certain time. When the compound has dissolved fully, it is filtered through a 5 μm filter and applied by spincoating with a spincoater at variable speeds (400-6000). It is thus possible to vary the layer thicknesses in the range of from approx. 50 to 300 nm. Beforehand, a conductive polymer, preferably doped PEDOT or PANI, is usually applied to the (structured) ITO. Electrodes are also applied to the thus obtained polymer films. This is generally effected by thermal vapor deposition (Balzer BA360 or Pfeiffer PL S 500). Subsequently, the transparent ITO electrode is contacted as the anode and the metal electrode (for example Ba, Yb, Ca) as the cathode, and the device parameters are determined.

The results which have been obtained with poly(arylenevinylenes) which have been synthesized by the process according to the invention are compiled in Table 1.

What is claimed is:

1. A process for preparing poly(arylenevinylenes) from bis(halomethyl)arylene of the formula (XXVI),

Formula (XXVI)

which comprises base-induced dehydrohalogenation, wherein the reaction is carried out in the presence of between 2 and 40 mol% of one or more compounds of the formula (I):

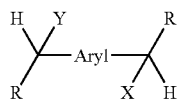

Formula (I)

where the symbols are defined as follows:

Aryl is the same or different at each instance and is a bivalent aromatic or heteroaromatic ring system which has from 2 to 40 carbon atoms and is substituted by $R^1$ radicals, or an $R^1$-substituted or unsubstituted stilbenylene unit; the two substituents CHXR and CHYR are arranged in such a way that there is an even number of aromatic atoms between them; the aryl and heteroaryl systems may also be part of a larger fused aromatic ring system; the possible substituents $R^1$ may potentially be situated at any free position;

R is the same or different at each instance and is an alkyl chain which has from 4 to 40 carbon atoms, and may also be substituted by one or more $R^1$ radicals or be unsubstituted, in which one or more nonadjacent carbon atoms may also be replaced by —$CR^2$=$CR^2$—, —C≡C—, —$NR^2$—, —O—, —S—, —CO—, —CO—O—, —$CONR^2$—, —O—CO—O—, and one or more hydrogen atoms may also be replaced by fluorine, an aromatic or heteroaromatic ring system which has from 2 to 40 carbon atoms and may be substituted by $R^1$ or be unsubstituted, an $R^1$-substituted or unsubstituted stilbenyl or tolanyl unit, —$Si(R^2)_3$, —$N(R^2)_2$, —$OR^2$ or a combination of these systems; the aryl and heteroaryl systems may also be part of a larger fused aromatic ring system; the possible substituents may potentially be situated at any free position;

X is the same or different at each instance and is Cl, Br, I, trifluoromethanesulfonate or arylsulfonate;

Y is the same or different at each instance and is Cl, Br, I, trifluoromethanesulfonate, arylsulfonate or $R^1$;

Z is the same or different at each instance and is Cl, Br, I, trifluoromethanesulfonate, arylsulfonate or —$S(O)R^2$;

$R^1$ is the same or different at each instance and is a straight-chain, branched or cyclic alkyl chain having from 1 to 40 carbon atoms, in which one or more nonadjacent carbon atoms may also be replaced by —$CR^2$=$CR^2$—, —C≡C—, —$NR^2$—, —O—, —S—, —CO—, —CO—O—, —$CONR^2$—, —O—CO—O—, and one or more hydrogen atoms may be replaced by fluorine, an aromatic or heteroaromatic ring system which has from 2 to 40 carbon atoms and may also be substituted by one or more nonaromatic $R^1$ radicals, a substituted or unsubstituted vinyl group or Cl, F, CN, $N(R^2)_2$, $B(R^2)_2$; the aryl and heteroaryl systems may also be part of a larger fused aromatic ring system; the possible substituents may potentially be situated at any free position; two or more $R^1$ radicals together may also form a ring system;

$R^2$ is the same or different at each instance and is H, a straight-chain, branched or cyclic alkyl chain having 1 to 22 carbon atoms, in which one or more nonadjacent carbon atoms may also be replaced by —O—, —S—, —CO—O—, —O—CO—O—, and one or more hydrogen atoms may also be replaced by fluorine, an aryl or heteroaryl system which has from 2 to 40 carbon atoms and may also be substituted by one or more nonaromatic $R^1$.

2. The process as claimed in claim 1, wherein the halogen atoms in the bis(halomethyl)arylene monomers are the same or different and are each Cl, Br or I.

3. The process as claimed in claim 1, wherein the polymerization is carried out in an ether, an aromatic hydrocarbon, a chlorinated aromatic compound or a mixture of these solvents.

4. The process as claimed in claim 1, wherein the reaction is carried out in a concentration range from 0.005 to 5 mol/L (monomer/solution volume).

5. The process as claimed in claim 1, wherein the bases used are alkali metal hydroxides, alkali metal alkoxides or organic amines or amides, or else alkali metal hydrides or metal organyls, provided that the solvents used are not DMSO, alcohols or chlorinated solvents.

6. The process as claimed in claim 1, wherein the amount of the base used is in the range from 2 to 10 equivalents (based on one equivalent of monomer).

7. The process as claimed in claim 1, wherein for the compound of the formula (I):

Aryl is the same or different at each instance and is a bivalent aromatic ring system which has from 2 to 40 carbon atoms and is substituted by up to 4 substituents $R^1$, or an $R^1$-substituted or unsubstituted stilbenylene unit; the two substituents CHXR and CHYR are arranged in such a way that there is an even number of aromatic atoms between them; the aryl system optionally is part of a larger fused aromatic ring system; the possible substituents $R^1$ may potentially be situated at any free position; and X is the same or different at each instance and is Cl, Br, I.

8. The process as claimed in claim 7, wherein the compound of the formula (I) is selected from the formulae (II) to (XXV) which may be substituted or unsubstituted:

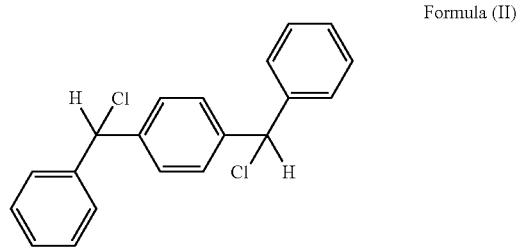

Formula (II)

-continued
Formula (III)
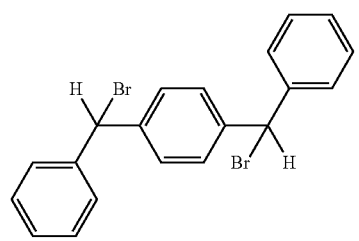
Formula (IV)
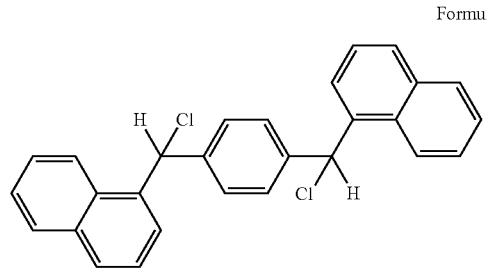
Formula (V)
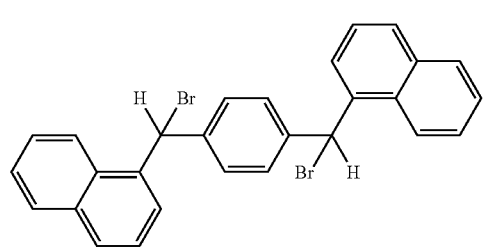
Formula (VI)
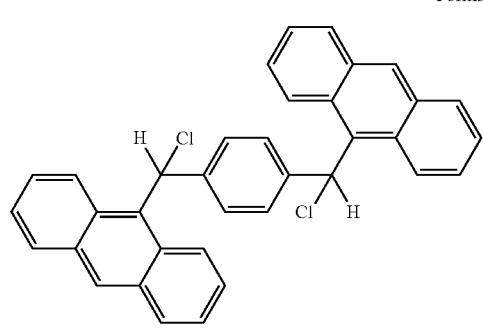
Formula (VII)
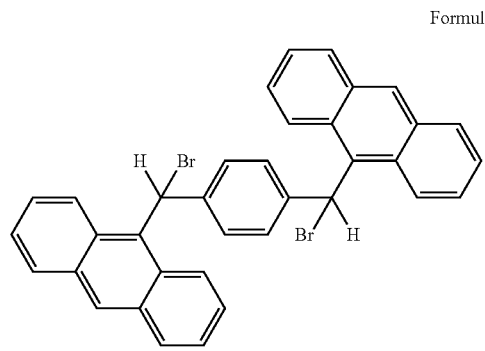
Formula (VIII)
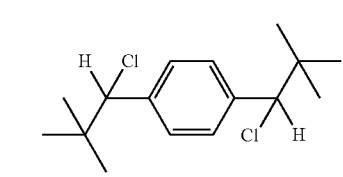
Formula (IX)
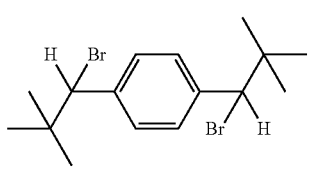
Formula (X)
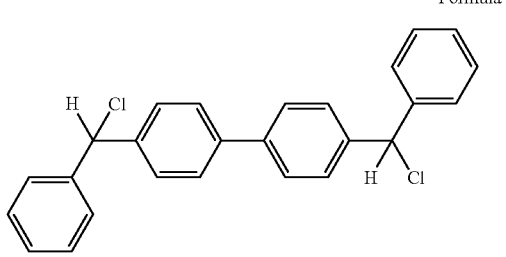
Formula (XI)
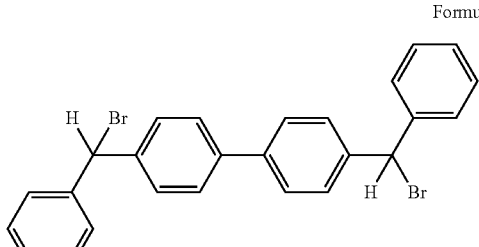
Formula (XII)
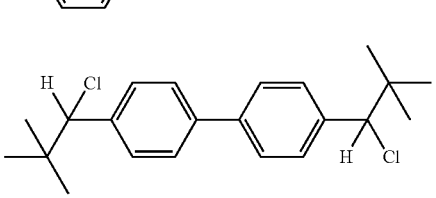
Formula (XIII)
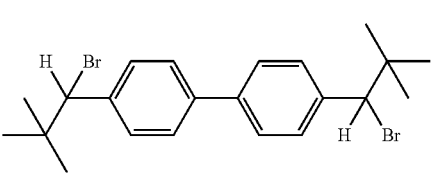
Formula (XIV)
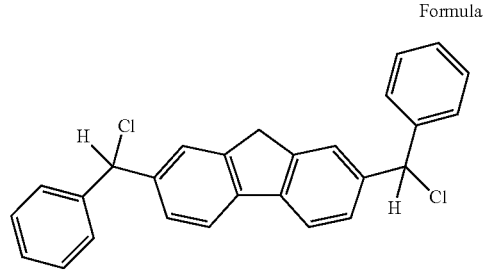
Formula (XV)
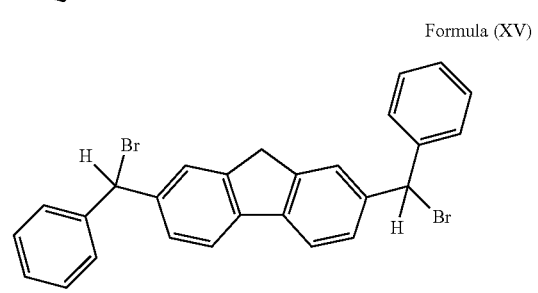

-continued
Formula (XVI)
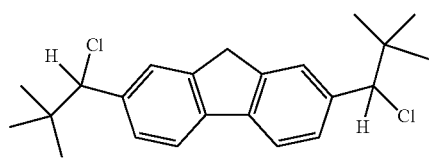
Formula (XVII)
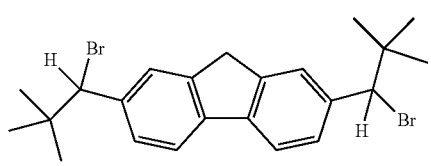
Formula (XVIII)
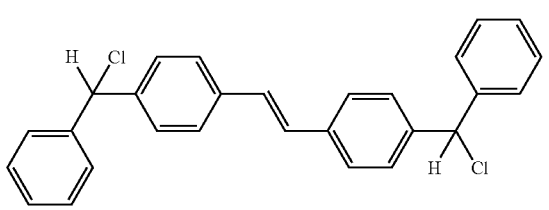
Formula (XIX)
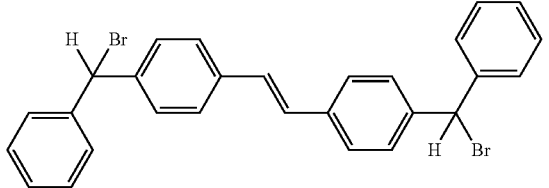
Formula (XX)
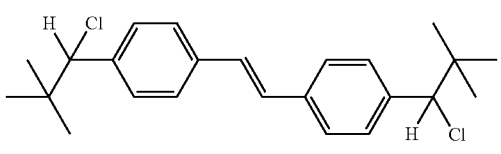
Formula (XXI)
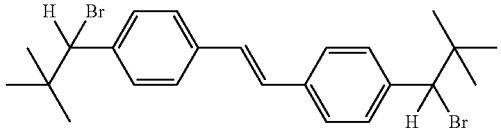
Formula (XXII)
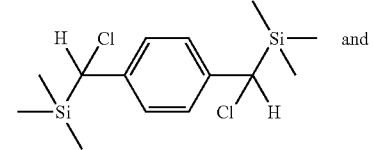 and
Formula (XXIII)
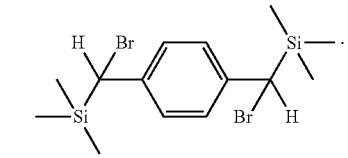
* * * * *